United States Patent [19]

Kazama

[11] Patent Number: 5,003,255

[45] Date of Patent: Mar. 26, 1991

[54] ELECTRIC CONTACT PROBE

[75] Inventor: Toshio Kazama, Kanagawa, Japan

[73] Assignee: NHK Spring Co., Ltd., Kanagawa, Japan

[21] Appl. No.: 536,516

[22] Filed: Jun. 12, 1990

[30] Foreign Application Priority Data

Jun. 15, 1989 [JP] Japan .................................. 1-153223
Dec. 27, 1989 [JP] Japan .................................. 1-339189

[51] Int. Cl.$^5$ ........................ G01R 1/06; G01R 31/02
[52] U.S. Cl. ........................ 324/158 P; 324/72.5; 324/158 F
[58] Field of Search ............... 324/158 P, 158 F, 72.5, 324/500, 537; 439/482

[56] References Cited

U.S. PATENT DOCUMENTS 4,658,212  4/1987  Ozawa et al. .................... 324/158 F
4,904,935  2/1990  Calma et al. .................... 324/158 F

FOREIGN PATENT DOCUMENTS 3500227  7/1986  Fed. Rep. of Germany ... 324/158 P
3702201  9/1987  Fed. Rep. of Germany ... 324/158 P

*Primary Examiner*—Kenneth Wieder
*Assistant Examiner*—Vinh P. Nguyen
*Attorney, Agent, or Firm*—Jeffers, Hoffman & Niewyk

[57] ABSTRACT

An electric contact probe, including: a needle member made of electroconductive material having a pointed free end, a rod portion having a smaller diameter than the rod portion, and a head portion provided at another end of the stem portion; a tubular receptacle receiving a base end of the needle member therein in an axially slidable manner; a compression coil spring wrapped around the stem portion between an annular shoulder surface between the rod portion and the stem portion, and the head; an annular contricted part provided in the tubular receptacle to restrict axially inward movement of an axially inner end of the compression coil spring; and a small radially inward projection provided in the receptacle a small distance away from the constricted part toward the free end of the needle member to detachably engage an axially inner end portion of the compression oil spring. Thus, the needle member assembly may be readily installed and removed as desired so as to facilitate the fabrication and the maintenance of the contact probe system. Furthermore, since the outer diameter of the compression coil spring may be increased up to the inner diameter of the receptacle, the spring force of the compression coil spring can be increased to a sufficient extent to ensure a stable state of contact at the pointed end of the needle member.

8 Claims, 10 Drawing Sheets

Fig.1
Fig.2
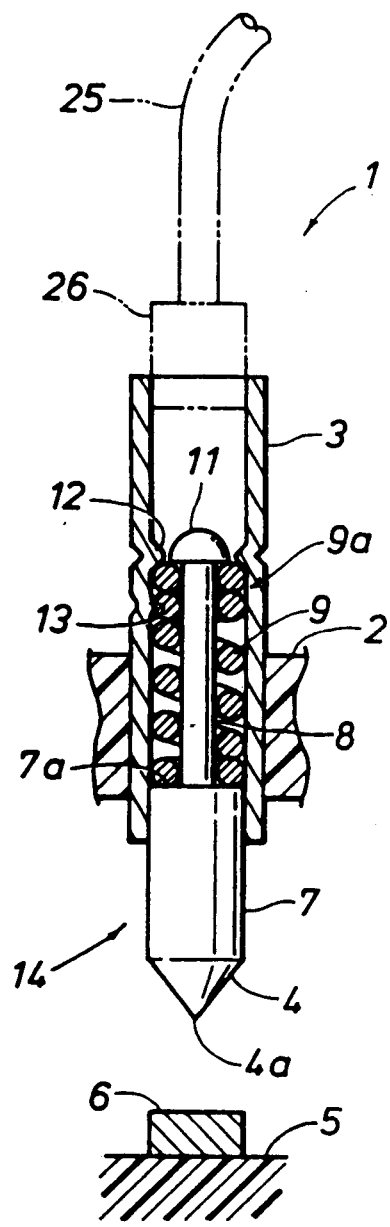
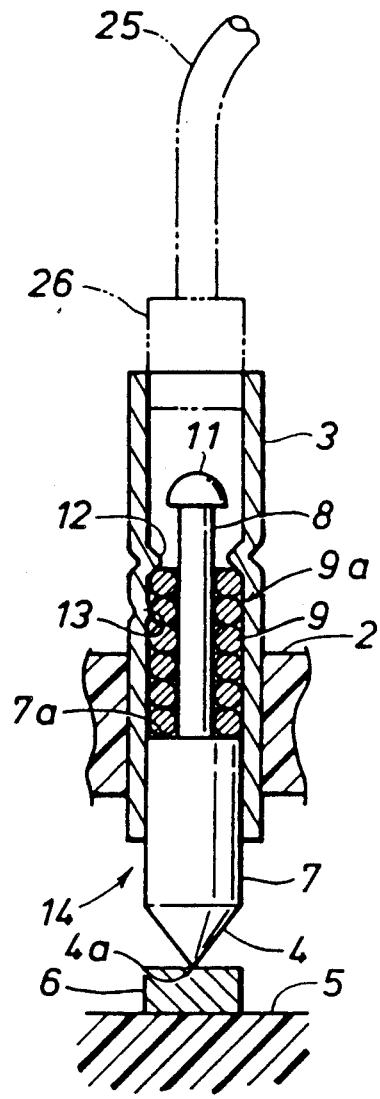

Fig. 10
Fig. 11
Fig. 12
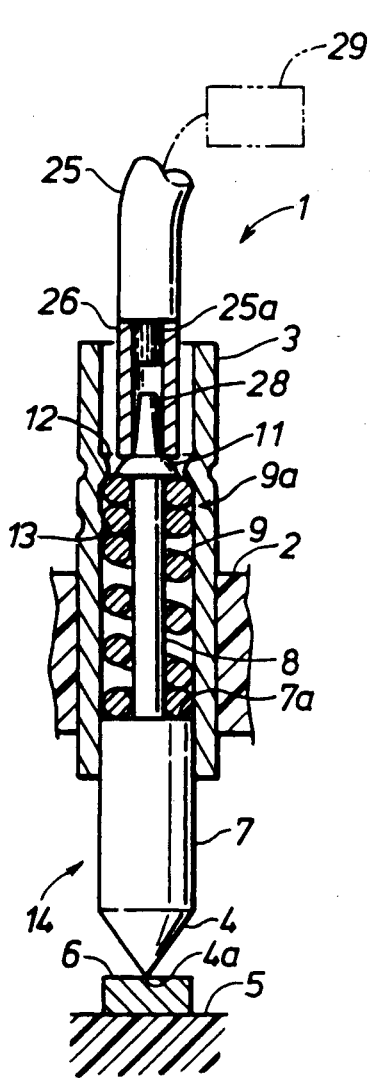
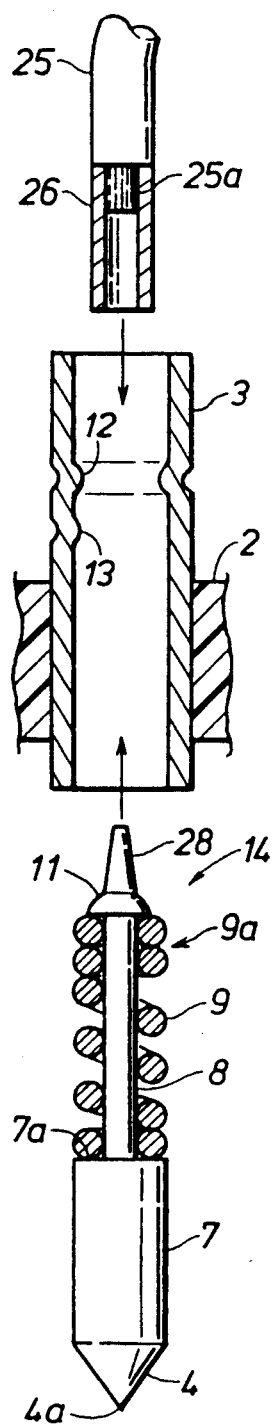
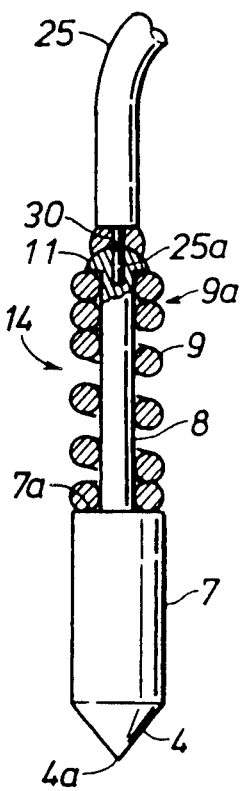

Fig.15
Fig.16
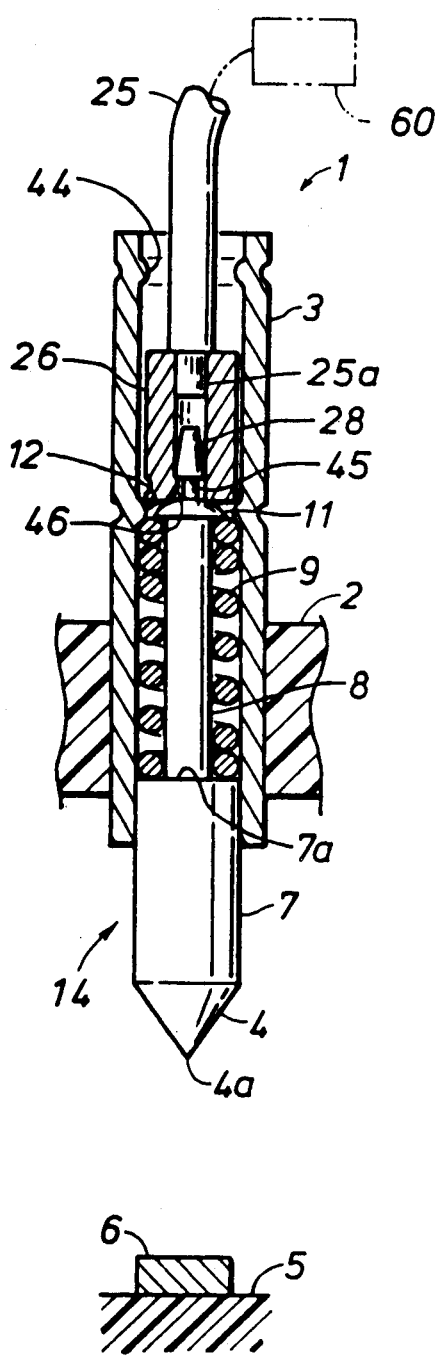
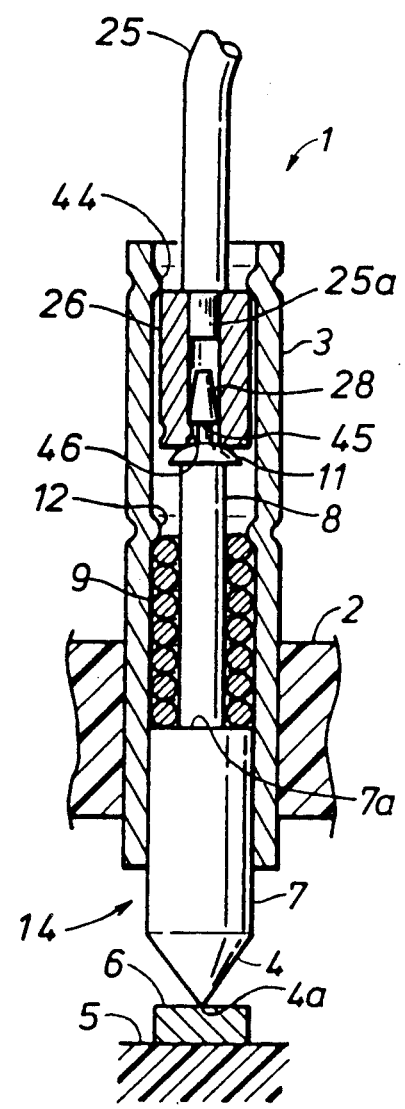

Fig. 19
Fig. 20
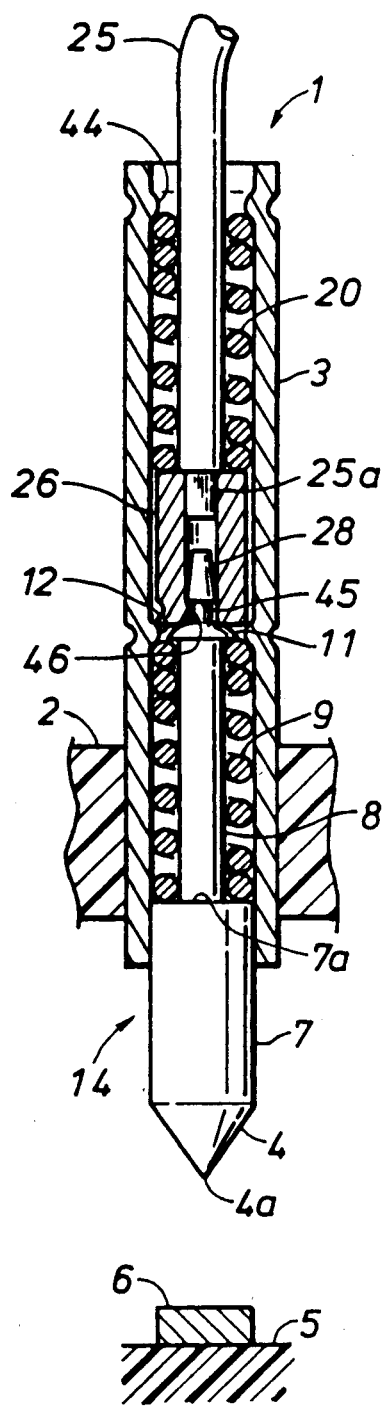
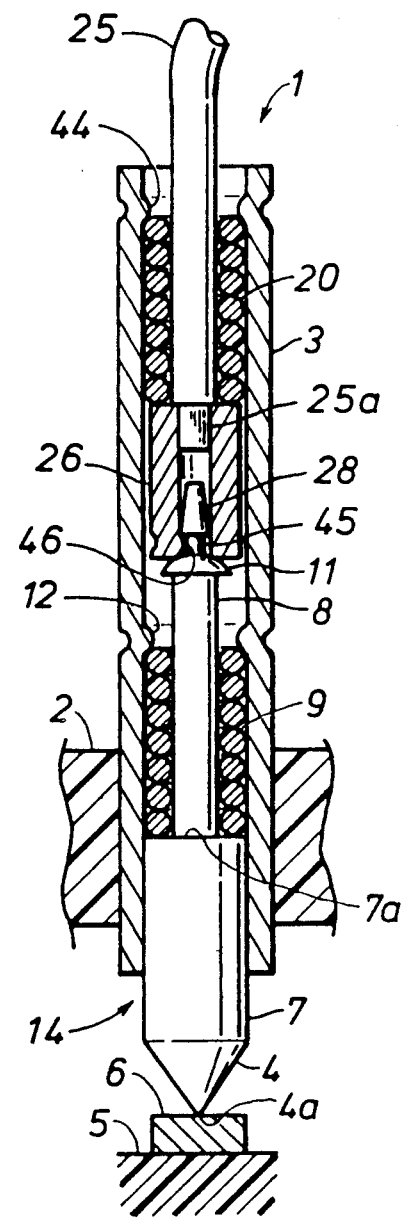

Fig. 21
Fig. 22
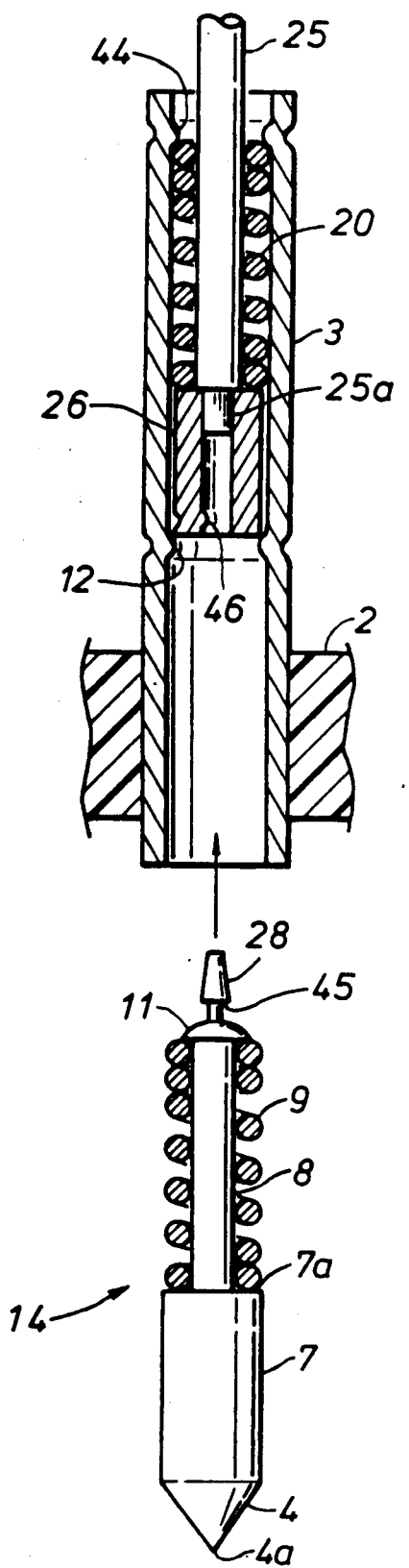
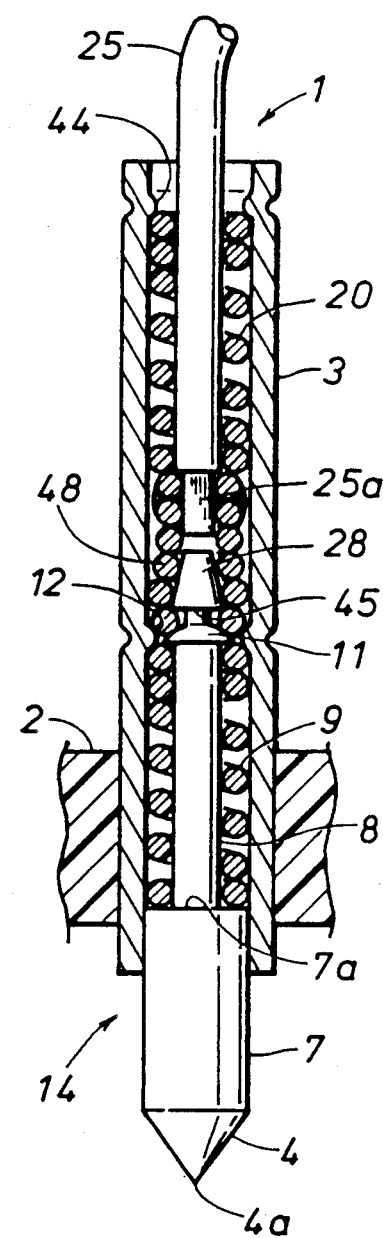

ELECTRIC CONTACT PROBE

TECHNICAL FIELD

The present invention relates to an electric contact probe which is suitable for use in electric testing systems for testing printed circuit boards, integrated circuits and other electric equipment and systems.

BACKGROUND OF THE INVENTION

Various contact probes have been used for testing printed circuit boards and electronic devices, and a typical conventional contact probe consists of a tubular sleeve called as a receptacle, a needle member slidably received in the receptacle with its pointed end projecting from one end of the receptacle, and a compression coil spring applying an outward urging force to the needle member. Since such contact probes are required to be used on integrated circuits and other high density electronic devices, they are desired to have extremely small diameters sometimes in the order of hundredths of a millimeter.

FIGS. 13 and 14 show a typical conventional contact probe 101. A receptacle 103 formed of a metallic tubular member is passed through and fixedly secured to an insulated base board 102, and a barrel 106 consisting of a tubular member which is substantially enclosed at its base end is detachably fitted in the inner bore of the receptacle 103. The barrel 106 receives a needle member 107 in axially slidable manner. The needle member 107 is urged towards the open free end of the barrel 106 by a compression coil spring 109 which is interposed between a head 108 provided in the base end of the needle member 107 and the closed end of the barrel 106, and an annular constricted part 110 of the barrel 106 engages the head 108 so as to define the extent to which the needle member 107 can project out of the barrel 106.

The receptacle 103 is provided with a large projection 104 which engages the closed end of the barrel 106 to define the extent to which the barrel 106 may be fitted into the receptacle 103. The receptacle 103 is also provided with a smaller projection 105 which resiliently and frictionally engages annular groove formed around the outer circumferential surface of the barrel 106 to define the aforementioned annular constricted part 110.

Thus, when the barrel assembly 111 consisting of the barrel 106, the needle member 107 and the compression coil spring 109 is fitted into the receptacle 103 as illustrated in FIG. 14, the barrel assembly 111 can be locked in place in the receptacle 103 in a detachable manner.

However, it is desired to reduce the diameter of the contact probe as much as possible as a large number of such contact probes are required to be arranged in the insulated base board 102 of an automated testing machine, which is not shown in the drawings, in a highly dense manner, and it becomes increasingly difficult to ensure a sufficient spring force acting upon the needle member as the wire diameter and the coil diameter of the compression coil spring 109 in the barrel 106 are reduced. Therefore, according to this conventional contact probe 101, it was difficult to ensure a sufficient spring force and a sufficient mechanical strength to the needle member as the density of the contact probes is increased and the overall outer diameter of each contact probe is reduced.

Furthermore, since there is a relatively large number of separate component parts involved in the electroconductive path between the needle member 107 and a lead wire 112 which is typically connected to the base end of the receptacle 103 by way of a plug 113 press fitted thereinto.

It is also desired to be able to easily replace the needle member so as to simplify the manufacture and maintenance of the contact probe. When the entire contact probe is to be replaced, it is desired to be able to readily disconnect the lead wire and reconnect it to a new contact probe.

BRIEF SUMMARY OF THE INVENTION

In view of such problems of the prior art, a primary object of the present invention is to provide a contact probe which ensures a sufficient spring force for urging its needle member while reducing the overall outer diameter of the contact probe.

A second object of the present invention is to provide a contact probe which is easy to fabricate.

A third object of the present invention is to provide a contact probe which allows its needle member to be replaced in a simple fashion.

A fourth object of the present invention is to provide a contact probe which is equipped with an improved lead wire coupling structure.

These and other objects of the present invention can be accomplished by providing an electric contact probe, comprising: a needle member made of electroconductive material having a free end adapted to come into contact with an object to be tested, a rod portion adjoining the free end, a stem portion adjoining the rod portion and having a smaller diameter than the rod portion, and a head portion provided at another end of the stem portion; a tubular receptacle receiving a base end of the needle member therein in an axially slidable manner; a compression coil spring wrapped around the stem portion between an annular shoulder surface between the rod portion and the stem portion, and the head; first engagement means provided in the tubular receptacle to restrict axially inward movement of an axially inner end of the compression coil spring; and second engagement means provided in the receptacle a small distance away from the first engagement means toward the free end of the needle member to detachably engage an axially inner end portion of the compression coil spring.

Thus, the needle member assembly may be readily installed and removed as desired so as to facilitate the fabrication and the maintenance of the contact probe system. Furthermore, since the outer diameter of the compression coil spring may be increased up to the inner diameter of the receptacle, the spring force of the compression coil spring can be increased to a sufficient extent to ensure a stable state of contact at the pointed end of the needle member. Also, since the sliding contact within the electric path of the contact probe is minimized, the internal resistance of the contact probe is minimized.

According to a preferred embodiment of the present invention, the first engagement means consists of an annular constricted part of the tubular receptacle, and the second engagement means consists of a small radially inward projection provided in the tubular receptacle. Thus, these engagement means may be formed simply by crimping appropriate parts of the receptacle. Also, the head may consist of an axially inner end of the stem portion enlarged in diameter by crimping, or, alternatively, a sleeve press fitted onto the other end of the stem portion.

The lead wire may be connected to the head of the needle member either in a detachable manner or in a fixed manner depending on each particular need.

Optionally, a sleeve may be slidably fitted on the stem portion between the head and the axially inner end of the compression coil spring so that the second engagement means may engage the axially inner end of the compression coil spring via the slidable sleeve, instead of directly engaging the axially inner end of the compression coil spring. This may improve the reliability of the engagement of the needle member assembly consisting of the needle member and the compression coil spring by the second engagement means in a relatively simple manner.

According to another aspect of the present invention, the electric contact probe comprises a needle member made of electroconductive material having a free end adapted to come into contact with an object to be tested, a rod portion adjoining the free end, a large diameter portion adjoining the rod portion having a smaller diameter than the rod portion, a small diameter portion having a smaller diameter than the large diameter portion, and a head provided in another end of the small diameter portion; a tubular receptacle receiving a base end of the needle member therein in an axially slidable manner; a first compression coil spring wrapped around the large diameter portion and engaged by annular shoulder surface defined between the rod portion and the large diameter portion at its one end; a second compression coil spring wrapped around the small diameter portion and engaged by annular shoulder surface defined between the small diameter portion and the head; a guide sleeve slidably fitted on the large diameter portion and engaging another end of the first compression coil spring at its one end and another end of the second compression coil spring at its other end; first engagement means provided in the tubular receptacle to restrict axially inward movement of an axially inner end of the second compression coil spring; and second engagement means provided in the tubular receptacle to detachably engage the guide sleeve to the tubular receptacle.

Thus, in addition to the above mentioned advantages, the present invention can provide the additional advantage of further increasing the spring force acting upon the needle member without increasing the outer diameter of the contact probe.

According to yet another aspect of the present invention, the electric contact probe comprises a needle member made of electroconductive material having a free end adapted to come into contact with an object to be tested, a rod portion adjoining the free end, a stem portion adjoining the rod portion and having a smaller diameter than the rod portion, and a head portion provided at another end of the stem portion; a tubular receptacle receiving a base end of the needle member therein in an axially slidable manner; a compression coil spring wrapped around the stem portion between an annular shoulder surface defined between the rod portion and the stem portion, and the head; first engagement means provided in the tubular receptacle to restrict axially inward movement of an axially inner end of the compression coil spring; coupling member for coupling a lead wire to the head in a detachable manner; and second engagement means provided in a base end of the receptacle to restrict outward movement of the coupling member beyond a certain limit, the first engagement means restricting axially inward movement of the coupling member.

Thus, according to the present invention, it is possible to form an electroconductive path of an extremely low resistance between the lead wire and the needle member by totally eliminating any sliding contact therefrom, and forming a truly continuous electric path therebetween. By interposing a second compression coil spring between the second engagement means and an opposing end of the coupling member, it is possible to further increase the spring force acting upon the needle member for a given outer diameter of the contact probe.

BRIEF DESCRIPTION OF THE DRAWINGS

The features and advantages of the electric contact probe according to the present invention will be more clearly appreciated from the following description taken in conjunction with the accompanying drawings in which like reference numerals designate like parts and elements throughout all the embodiments, in which:

FIG. 1 is a sectional side view of a first embodiment of the electric contact probe according to the present invention;

FIG. 2 is a sectional side view of the first embodiment when the needle member is brought into contact with an object to be tested;

FIG. 10 is a sectional side view of a sixth embodiment of the electric contact probe according to the present invention;

FIG. 11 is an exploded sectional side view of the sixth embodiment;

FIG. 12 is a sectional side view of a mode of fixedly attaching a lead wire to the head of the needle member (seventh embodiment);

FIGS. 15 through 17 are views similar to FIGS. 1 through 3, respectively, showing an eighth embodiment of the electric contact probe according to the present invention;

FIGS. 19 through 21 are views similar to FIGS. 1 through 3, respectively, showing a tenth embodiment of the electric contact probe according to the present invention;

FIG. 22 shows a yet another embodiment of the structure for detachably connecting a lead wire to the head of the needle member (eleventh embodiment)

DETAILED DESCRIPTION OF THE PREFERRED EMBODIMENTS

Figure 3:
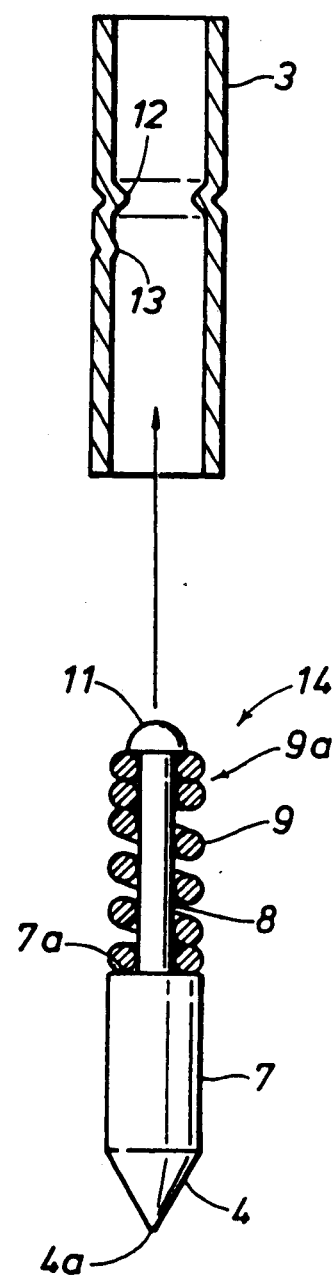
FIG. 3 is an exploded perspective view of the first embodiment.

FIG. 1 shows a first embodiment of the contact probe according to the present invention. This contact probe 1 comprises a receptacle 3 consisting of a tubular metallic member passed through an insulated base board 2 forming a part of an automated testing system and fixedly secured in that position, and an electroconductive needle member 4 which is slidably received in the receptacle 3.

One end 4a of the needle member 4 projecting from a free end of the receptacle 3 is formed as a sharply pointed end so that it can accurately come into contact with an object to be tested such as an electroconductive pattern 6 of a printed circuit board 5. The middle part of the needle member 4 comprises a rod portion 7 which adjoins the pointed end 4a of the needle member 4 and slidably received in the receptacle 3 substantially without any play, and a stem portion 8 having a substantially smaller diameter than the rod portion 7 and is formed on the other end of the rod portion 7 in a coaxial relationship. A compression coil spring 9 is fitted onto this stem portion 8, and is interposed between an annular shoulder surface 7a defined between the rod portion 7 and the stem portion 8, and a hemispherical head 11 formed in the free end (or the axially inner end) of the stem portion 8 in a compressed state. In other words, the compression coil spring 9 is kept in position by the annular shoulder surface 7a and the head 11.

The needle member 4 is provided with a closely wound portion 9a of a few turns on the side of the head 11, and this closely wound portion 9a determines the extent to which the compression coil spring 9 can move into the receptacle 3 by cooperating with an annular projection 12 of the receptacle 3 defined by a locally constricted portion of the receptacle 3. A small projection 13 is provided at a small distance from the aforementioned annular projection 12 towards the pointed end 4a of the needle member 4. Thus the position of the inner end of the compression coil spring 9 is determined by the annular projection 12, and is detachably secured at that position by resilient and frictional engagement with the small projection 13. In this way, the needle member 4 can move into and out of the receptacle 3 while it is urged outwards by the compression coil spring 9. A plug 26 connected to a lead wire 25 leading to a testing circuit not shown in the drawings is fitted into the base end of the receptacle 3 so as to establish a secure electric contact between the lead wire 25 and the receptacle 3.

When a probe head which includes the base board 2 is lowered and the pointed end 4a of the needle member 4 is pressed against the electroconductive pattern 6, the compression coil spring 9 is compressed as illustrated in FIG. 2, and the needle member 4 abuts an electroconductive pattern 6 of a printed circuit baord 5 under an appropriate spring force so that a favorable electric contact may be established therebetween. Since the electric contact between the lead wire 25 and the electroconductive pattern 6 is established by way of the rod portion 7 of the needle member 4 and the receptacle 3, it is possible to lower the internal resistance of the contact probe 1 to a significant extent as compared with comparable conventional contact probes.

FIG. 3 illustrates the process of assembling the contact probe 1. Initially, the needle member 4 is not provided with the head 11. First of all, the compression coil spring 9 is fitted onto the stem portion 8 from its free end or its axially inner end, and the head 11 is then formed by crimping the free end of the stem portion 8. Thereafter, the needle member assembly 14 consisting of the needle member 4 and the compression coil spring 9 is fitted into the free end of the receptacle 3 until the inner end of the compression coil spring 9 abuts the annular projection 12 of the receptacle 3. When this assembly 14 has been fitted into the receptacle 3 all the way, the axially inner end 9a of the compression coil spring 9 is resiliently compressed by the small projection 13, thereby frictionally engaging the axially inner end of the compression coil spring 9 with the small projection 13.

Figure 4:
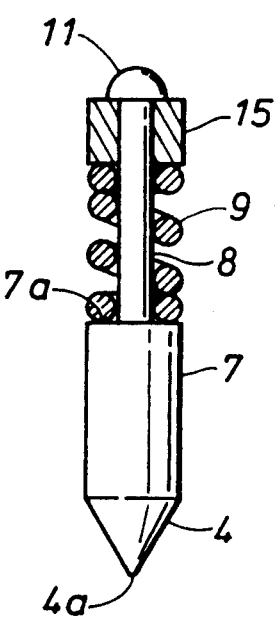
FIGS. 4 through 6 show different embodiments of the head for engaging the axially inner end of the compression coil spring (second through fourth embodiments)

FIG. 4 shows a second embodiment of the present invention which is provided with a collar 15 interposed between the axially inner end of the compression coil spring 9 and the hemispherical head 11. In this case, the collar 15 accomplishes the resilient and frictional engagement with the small projection 13 instead of the inner end of the compression coil spring 9. Therefore, fabrication of the compression coil spring 9 is simplified as compared with the first embodiment as the outer diameter of the compression coil spring may have a greater dimensional tolerance.

Figure 5:
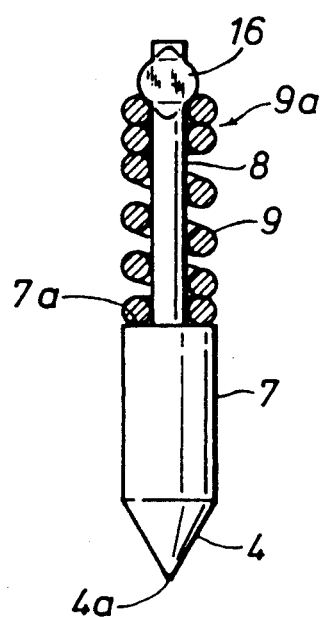
Figure 6:
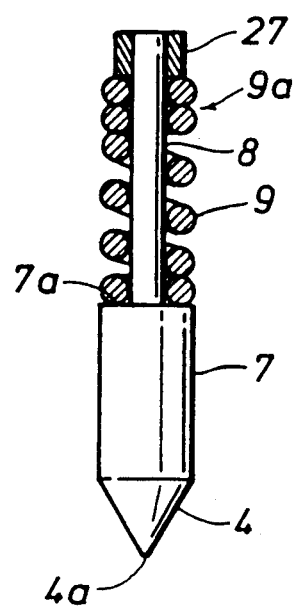

FIGS. 5 and 6 show third and fourth embodiments of the present invention featuring different modes of heads. The embodiment illustrated in FIG. 5 employs a flattened portion of the stem portion 8 as a head 16 for engaging the inner end of the compression coil spring 9. The embodiment illustrated in FIG. 6 employs a collar which is fitted onto the free end of the stem portion 8, and crimped, bonded, blazed, welded or otherwise secured thereto as a head 27 for engaging the inner end of the compression coil spring 9. In the latter case, as there is no need to deform the stem portion 8, fabrication of the needle member 4 is simplified.

Figure 7:
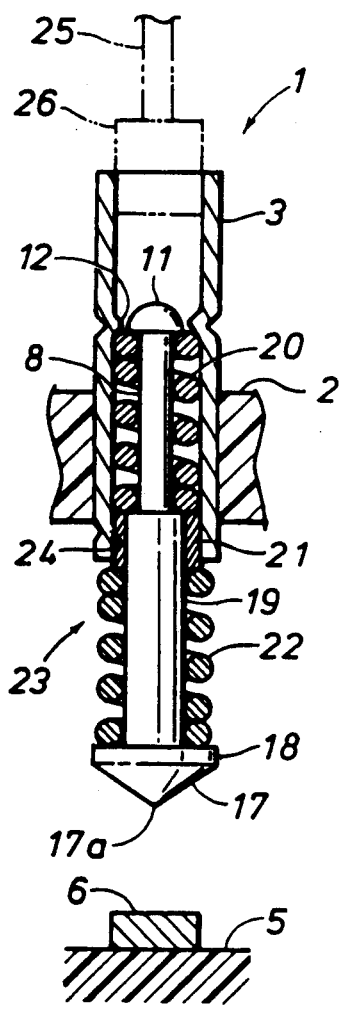
FIGS. 7 through 9 are views similar to FIGS. 1 through 3, respectively, showing fifth embodiment of the electric contact probe according to the present invention.
Figure 8:
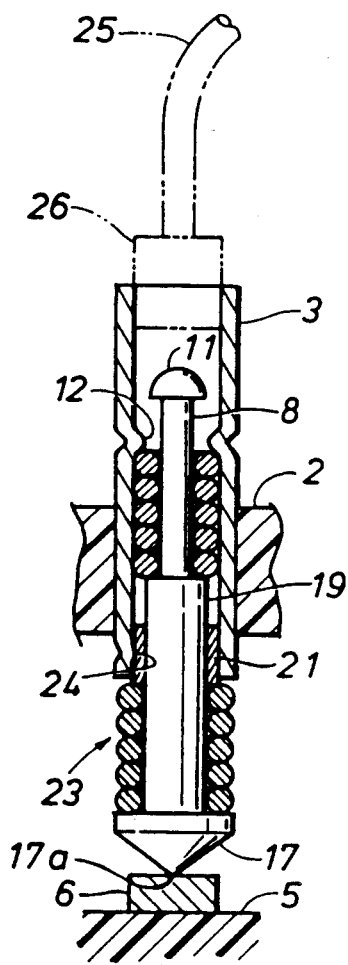

FIG. 7 shows a fifth embodiment of the present invention. According to this embodiment, a small diameter portion 19 is provided between the stem portion 8, and the rod portion 18. This small diameter portion 19 is intermediate between the stem portion 8 and the rod portion 18 in diameter. A collar 21 is slidably fitted onto a stem end of the small diameter portion 19, preferably substantially without any play. The inner diameter of the collar 21 is so determined that the collar 21 can slide freely over the small diameter portion 19 substantially without any play. A first compression coil spring 20 is wound around the stem portion 8, and is interposed between a head 11 provided in an axially inner end of the stem portion 8 and an annular shoulder defined between the stem portion 8 and the small diameter portion 19 in compressed state. A second compression coil spring 22 is interposed between the collar 21 and an annular shoulder defined between the rod portion 18 and the small diameter portion 19 also in compressed state.

The process of fabricating this contact probe is now described in the following with reference to FIG. 9. Initially, the free end of the stem portion 8 is not provided with the head 11. First of all, the second compression spring 22 is fitted onto the small diameter portion 19 of the needle member 17, and the collar 21 is fitted onto the stem end of the small diameter portion 19. Then, the first compression coil spring 20 is fitted onto the stem portion 8, and while it is kept in compressed state, the free end of the stem portion 8 is crimped so as to form the head 11. In this condition, since the spring force of the first compression coil spring 20 is substantially greater than that of the second compression coil spring 22, they assume the positions illustrated in FIG. 9. Thereafter, this assembly 23 is inserted into the receptacle 3 from its free end as illustrated in FIG. 9 until the collar 21 is resiliently and frictionally engaged by a small projection 24 provided in the receptacle 3 near its free end.

Figure 9:
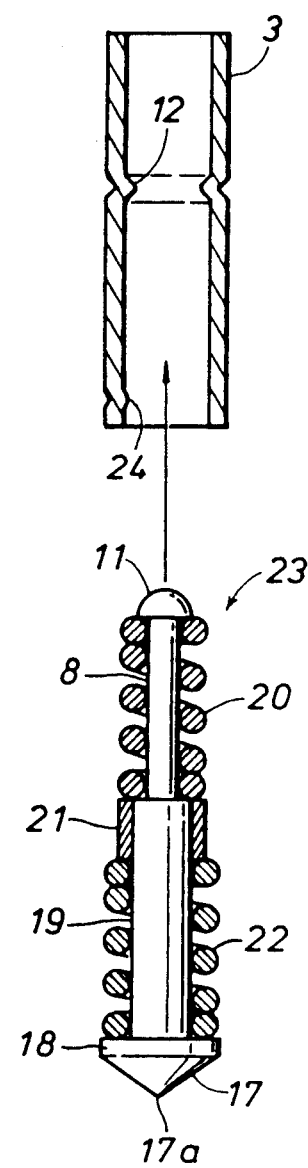
Figure 13:
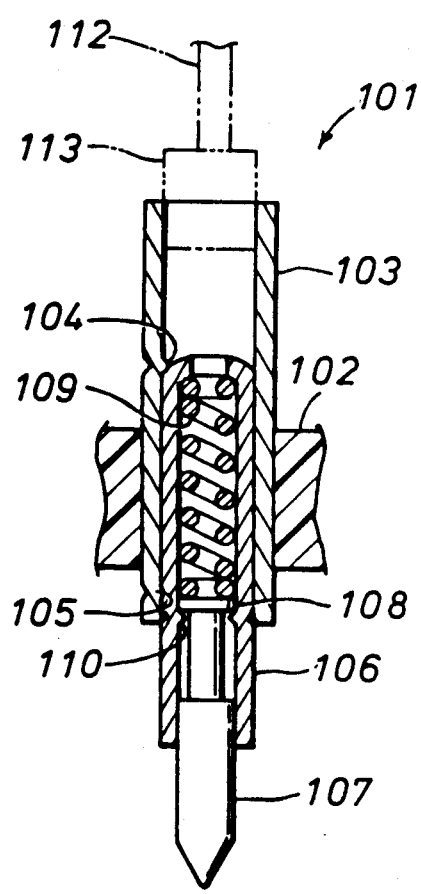
FIGS. 13 and 14 are a sectional side view and an exploded sectional side view, respectively, of a prior art electric contact probe.
Figure 14:
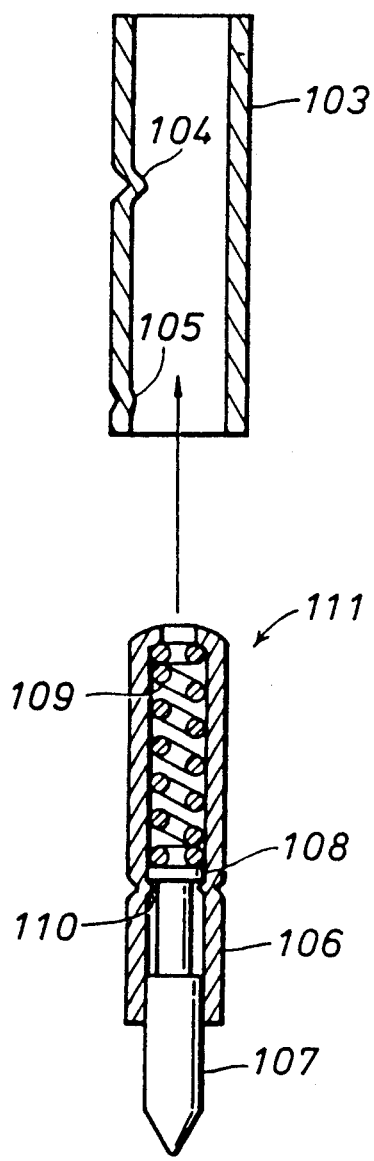

According to this embodiment, when the pointed end 17a of the needle member 17 is pressed against an electroconductive pattern 6 by lowering the base board 2, the two compression springs 20 and 22 are compressed by a same amount as illustrated in FIG. 9. This embodiment therefore offers a relatively large spring force particularly because the second compression coil spring 22 may have a relatively large diameter as compared with the inner diameter of the receptacle 3. In other words, this embodiment allows the outer diameter of the contact probe 1 to be reduced for a given spring force and stroke of the needle member.

For instance, according to this fifth embodiment, it is possible to use a stainless steel wire having a relatively high heat resistance for the compression coil springs 20 and 21 instead of normal spring steel (piano wire) so that the contact probe may be used in a high temperature environment for instance in the range of 120 to 150 degrees Celsius. Since the second compression coil spring 22 may have a relatively large diameter, it is possible to ensure a sufficient spring force without increasing the overall outer diameter of the contact probe.

FIGS. 10 and 11 show a sixth embodiment of the present invention. This embodiment is similar to the first embodiment but the free end of the head 11 is provided with a tapered or frusto-conical projection 28 which is adapted to be fitted into an end of an electroconductive sleeve 25 whose other end is crimped upon a core wire 25a of a lead cable 25. According to this embodiment, since there is no sliding contact between the lead core wire 25a and the needle member 4, the internal resistance of the contact probe can be reduced even further.

Alternative, as illustrated in FIG. 12 as a seventh embodiment of the present invention, a core wire 25a of a lead cable 25 may be directly soldered or otherwise securely attached to the head 11. In this case also, the needle member 4 may be readily removed from the receptacle 3 along with a certain length of its lead cable 25.

FIG. 15 shows an eighth embodiment of the present invention. This contact probe 1 comprises a receptacle 3 consisting of a tubular metallic member passed through an insulated base board 2 forming a part of an automated testing system and fixedly secured in that position, and an electroconductive needle member 4 which is slidably received in the receptacle 3.

One end 4a of the needle member 4 projecting from a free end of the receptacle 3 is formed as a sharply pointed end so that it can accurately come into contact with an object to be tested such as an electroconductive pattern 6 of a printed circuit board 5. The middle part of the needle member 4 comprises a rod portion 7 which adjoins the pointed end 4a of the needle member 4 and slidably received in the receptacle 3 substantially without any play, and a stem portion 8 having a substantially smaller diameter than the rod portion 7 and is formed on the other end of the rod portion 7 in a coaxial relationship. A compression coil spring 9 is fitted onto this stem portion 8, and is interposed between an annular shoulder surface 7a defined between the rod portion 7 and the stem portion 8, and a hemispherical head 11 formed in the free end of the stem portion 8 in a compressed state. In other words, the compression coil spring 9 is kept in position by the annular shoulder surface 7a and the head 11.

A middle part of the receptacle 3 is provided with an annular constricted part 12 against which the axially inner end of the compression coil spring 9 abuts. The free end of the head 11 is provided with a frusto-conical projection 28. A lead wire 25 connected to a testing circuit 60 is passed into the receptacle 3 from its base end, and its forward end consisting of an exposed length of its core wire 25a is fitted into an electroconductive sleeve 26 and is secured therein by crimping, soldering or other means. As illustrated in FIG. 15, the frusto-conical projection 28 is securely fitted into the sleeve 26 from is other end. A small projection 46 provided in the bore of the sleeve 26 engages a shoulder surface 45 provided in a base end of the frusto-conical projection 28 in a resilient and frictional fashion.

The base end of the receptacle 3 is provided with an annular constricted part 44 by crimping so that the electroconductive sleeve 26 may not come out of the base end of the receptacle 3. Also, the annular constricted part 12 prevents any further inward movement of the sleeve 26. Thus, the sleeve 26 is allowed to move axially inside the receptacle 3 in the range determined by the two annular constricted parts 12 and 44.

Referring to FIG. 16, when the base board 2 is lowered and the pointed end 4a of the needle member 4 is pressed against an electroconductive pattern 6 of a printed circuit board 5, the needle member 4 is pushed into the receptacle 3 against the biasing force of the compression coil spring 9. Thus, the needle member 4 is pushed against the electroconductive pattern 6 at an appropriate contact pressure, and a favorable electric contact is ensured therebetween.

When the compression coil spring 9 is substantially fully compressed (although it may not be intended to occur during normal use of the contact probe), the sleeve 26 comes into contact with the annular constricted part 44 of the receptacle 3. Therefore, the engagement between the annular projection 44 and the sleeve 26 effectively prevents excessive compression of the compression coil spring 9. When the compression coil spring 9 may be fully compressed without creating any problem, or it is not necessary to limit the axially inward movement of the needle member 4 by any special arrangement, the annular constricted part 44 may be omitted. When the needle member 4 is released, the compression coil spring 9 extends as illustrated in FIG. 15, and the sleeve 26 is engaged by the annular constricted part 12, thereby defining the extent to which the pointed end 4a of the needle member 4 projects from the receptacle 3.

Figure 17:
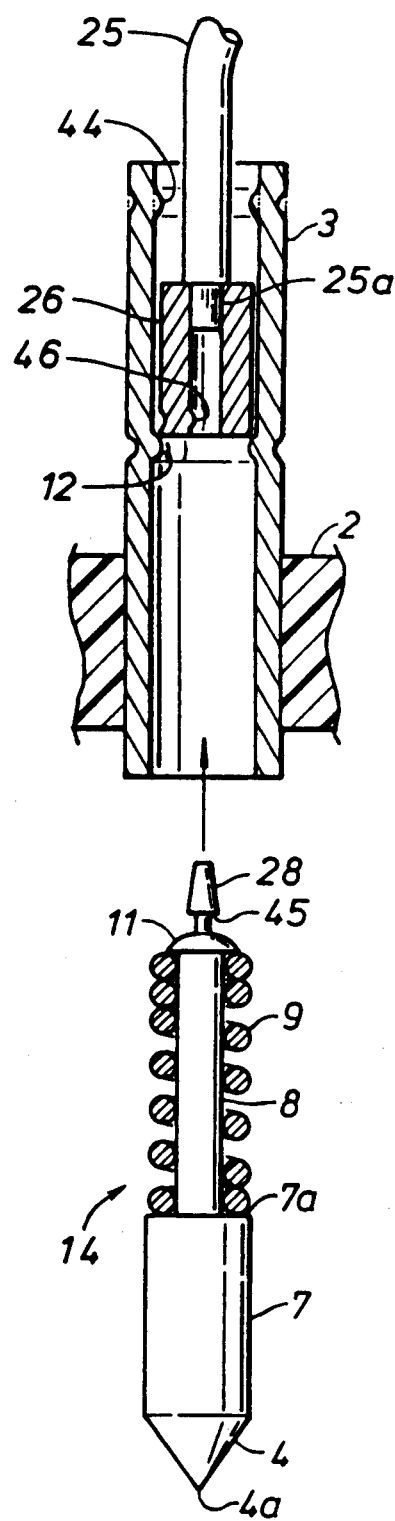

FIG. 17 shows the manner in which the contact probe 1 is assembled. The sleeve 26 along with a wire end connected thereto is inserted into the receptacle 3 from its base end before forming the annular constricted part 44 by crimping. Thus, the sleeve 26 is trapped between the two annular constricted parts 44 and 12. The compression coil spring 9 is fitted onto the stem portion 8 of the needle member 4 before forming the head 11. Then, the head 11 along with the frusto-conical projection 28 is formed so that the compression coil 9 may be interposed between the head 11 and the annular shoulder surface 7a between the stem portion 8 and the rod portion 7 of the needle member 4, thereby forming a needle member assembly 14. This needle member assembly 14 is then pushed into the receptacle 3 from its free end until the frusto-conical projection 28 is securely fitted into the sleeve 26 by virtue of the small projection 46 provided in the bore of the sleeve 26. Thus, the process of fabricating the contact probe is extremely simplified as compared with the prior art.

Further, if the needle member is damaged or worn out, it can be readily replaced without requiring any crimping or soldering process, and the maintenance of the contact probe head is extremely simplified. Moreover, since the electric conductive path from the needle member 4 to the lead wire 25 does not involve any sliding contact, it is possible to reduce the internal resistance of the contact probe to an extremely small level.

Figure 18:
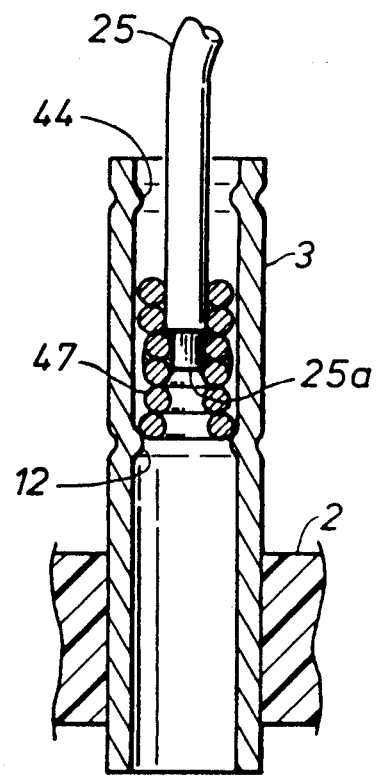
FIG. 18 shows an alternate embodiment of the structure for detachably connecting a lead wire to the head of the needle member (ninth embodiment)

FIG. 18 shows a ninth embodiment of the present invention, the engagement between the lead wire 25 and the frusto-conical projection 28 of the needle member 28 may be accomplished by using a coil spring 47 instead of the sleeve 26 of the previous embodiment. In this embodiment, an exposed wire end 25a of a lead wire 25 is fitted into the coil spring 47 and is fixedly secured thereby by soldering. By virtue of the elastic property of this coil spring 47, the frusto-conical projection 28 can be detachably connected to the coil spring 47. Otherwise, this coil spring 47 functions basically the same way as the sleeve 26 of the previous embodiment.

FIG. 19 shows a tenth embodiment of the present invention which allows the spring force acting on its needle member to be increased without increasing its overall outer diameter. The receptacle 3 for this contact probe 1 is relatively elongated at its base end where an electroconductive sleeve 26 leading to a lead wire 25 is slidably received. A second compression coil spring 20 is interposed between the base end of the sleeve 26 and the annular projection 44 provided near the extreme base end of the receptacle 3.

According to this embodiment, when the pointed end 4a of the needle member 4 is pressed against an electroconductive pattern 6 of a printed circuit board 5 as illustrated in FIG. 20, the two compression coil springs 9 and 20 both having a substantially same outer diameter jointly act upon the needle member 4, and it is possible to obtain twice the spring force of the previous embodiment for a given outer diameter of the contact probe 1. The needle member assembly 14 of this embodiment is identical to that of the previous embodiment, and it is therefore possible to use a same needle member assembly 14 interchangeably between these two different contact probes having different properties.

FIG. 21 illustrates the process of assembling the contact probe of this embodiment. First of all, the second compression coil spring 20 is fitted onto a free end of a lead wire 25, and the electroconductive sleeve 26 is attached to the free end of the lead wire 25 by way of an exposed core wire end 25a. The sleeve 26 along with the second compression coil spring 20 is placed in the base end of the receptacle 3, and the annular projection 44 is formed so as to confine the compression coil spring 20 and the sleeve 26 between the two annular projections 44 and 12 of the receptacle 3. Thereafter, in the same way as in the previous embodiment, the needle member assembly 14 is pushed into the receptacle 3 from its free end until the frusto-conical projection 28 of the needle member 4 is securely fitted into the sleeve 26 and engaged by the small projection 46.

FIG. 22 shows an eleventh embodiment of the present invention employing a coil spring 48, similar to the coil spring 47 illustrated in FIG. 18, instead of the sleeve 26. Otherwise, this embodiment is similar to the previous embodiment illustrated in FIGS. 19 and 20.

Figure 23:
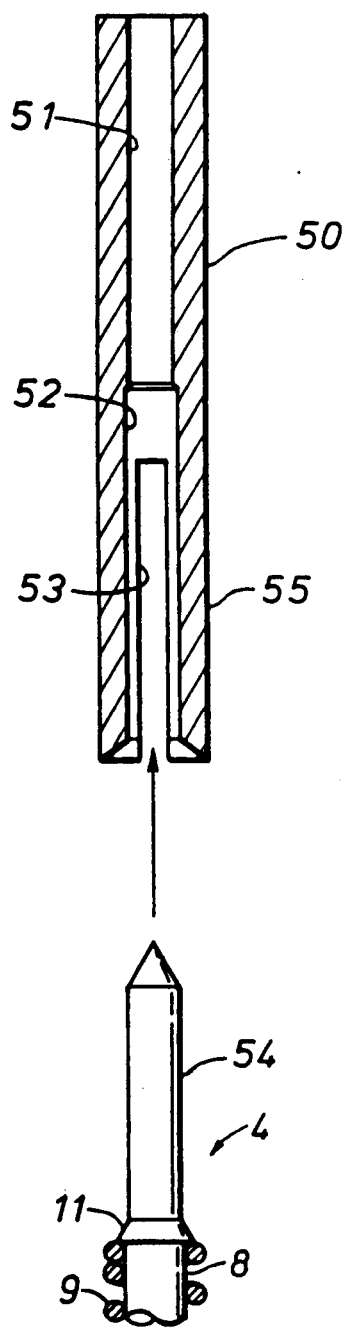
FIGS. 23 and 24 are a fragmentary exploded sectional side view and a fragmentary sectional side view, respectively, of yet another embodiment of the structure for detachably connecting a lead wire to the head of the needle member (twelfth embodiment).
Figure 24:
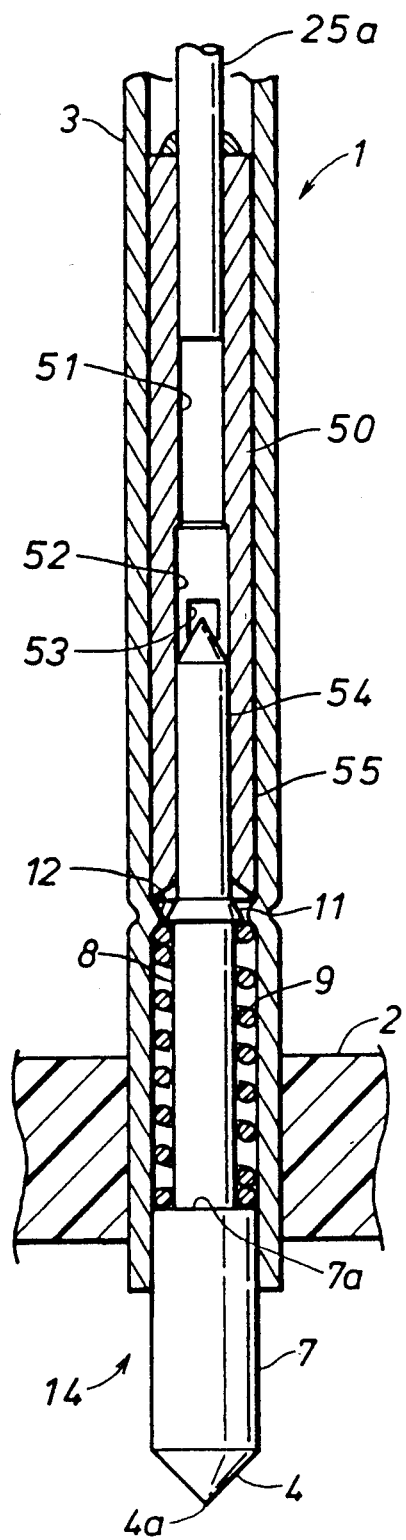

FIGS. 23 and 24 show a twelfth embodiment of the present invention. A core wire end 25a is fitted into a relatively elongated electroconductive sleeve 50 from its base end formed as a small diameter bore 51, and is attached thereto by soldering. The free end of the sleeve 50 is provided with a large diameter bore 52, and a plurality of longitudinal slits 53 are cut into the sleeve 50 from its free end. This sleeve 50 is slidably received in the base end of the receptacle 3, and is optionally prevented from coming off from the base end of the receptacle 3 by means of an annular constricted part (not shown in the drawings) similar to that denoted by numeral 44 in the previous embodiment.

The head 11 at the base end of the needle member 4 is provided with a columnar projection 54 having a pointed end. Thus, when this columnar projection 54 is pushed into the free end of the sleeve 50, the projection 54 is securely and resiliently received in the large diameter bore 52 of the sleeve 50. According to this embodiment, the projection 54 can be engaged by the sleeve 50 over a large area of contact, and it is therefore possible to reduce the overall inner resistance of the contact probe.

It should be understood that while preferred embodiments of the invention have been shown and described, they are illustrative and may be modified by those skilled in the art without departing from the scope thereof, which is to be limited only by the claims herein.

What we claim is:

1. An electric contact probe, comprising:
    a needle member made of electroconductive material having a free end adapted to come into contact with an object to be tested, a rod portion adjoining said free end, a stem portion adjoining said rod portion and having a smaller diameter than said rod portion, and a head portion provided at another end of said stem portion;
    a tubular receptacle receiving a base end of said needle member therein in an axially slidable manner;
    a compression coil spring wrapped around said stem portion between an annular shoulder surface between said rod portion and said stem portion, and said head;
    first engagement means provided in said tubular receptacle to restrict axially inward movement of an axially inner end of said compression coil spring; and
    second engagement means provided in said receptacle a small distance away from said first engagement means toward said free end of said needle member to detachably engage an axially inner end portion of said compression coil spring.

2. An electric contact probe according to claim 1 wherein said first engagement means consists of an annular constricted part of said tubular receptacle.

3. An electric contact probe according to claim 2, wherein said second engagement means consists of a small radially inward projection provided in said tubular receptacle.

4. An electric contact probe according to claim 1, wherein a sleeve is slidably fitted on said stem portion between said head and said axially inner end of said compression coil spring, and said second engagement means engages said axially inner end of said compression coil spring via said slidable sleeve.

5. An electric contact probe according to claim 1, wherein said head consists of an axially inner end of said stem portion enlarged in diameter by crimping.

6. An electric contact probe according to claim 1, wherein said head consists of a sleeve press fitted onto said other end of said stem portion.

7. An electric contact probe according to claim 1, wherein a lead wire is fixedly connected to said head of said needle member.

8. An electric contact probe according to claim 1, wherein a lead wire is detachably connected to said head of said needle member.

* * * * *